United States Patent [19]

Isobe et al.

[11] Patent Number: 4,933,579

[45] Date of Patent: Jun. 12, 1990

[54] OUTPUT CIRCUIT FOR A SEMICONDUCTOR DEVICE FOR REDUCING RISE TIME OF AN OUTPUT SIGNAL

[75] Inventors: Mitsuo Isobe; Makiji Kobayashi, both of Kanagawa, Japan

[73] Assignee: Kabushiki Kaisha Toshiba, Kanagawa, Japan

[21] Appl. No.: 261,209

[22] Filed: Oct. 24, 1988

[30] Foreign Application Priority Data

Oct. 30, 1987 [JP] Japan .................................. 62-275470

[51] Int. Cl.⁵ .................. H03K 5/08; H03K 17/04; H03K 17/687; H03K 19/017
[52] U.S. Cl. ............................ 307/592; 307/594; 307/548; 307/585; 307/473; 307/443
[58] Field of Search ............... 307/443, 448, 450, 451, 307/576, 579, 585, 255, 270, 592, 594, 473, 474, 548

[56] References Cited

U.S. PATENT DOCUMENTS

| | | | |
|---|---|---|---|
| 4,350,906 | 9/1982 | Gillberg | 307/473 X |
| 4,449,064 | 5/1984 | Eckert et al. | 307/473 |
| 4,728,822 | 3/1988 | Kusaka et al. | 307/473 X |
| 4,739,198 | 4/1988 | Maruyama | 307/473 X |
| 4,772,812 | 9/1988 | Desmarais | 307/473 |
| 4,794,281 | 12/1988 | Onodera et al. | 307/592 X |
| 4,797,585 | 1/1989 | Segawa et al. | 307/594 |

OTHER PUBLICATIONS

TC 74HCO3 P/F Technical Data Sheet.
Niewiadomski, "Logic Functions from Tri--State/Analogue Gates", New Electronics, vol. 15, No. 12, p. 69, Jun. 1982.

Primary Examiner—Stanley D. Miller
Assistant Examiner—David R. Bertelson
Attorney, Agent, or Firm—Finnegan, Henderson, Farabow, Garrett and Dunner

[57] ABSTRACT

An output circuit for outputting an output signal in response to an input signal having first and second voltage levels, comprises first circuit responsive to the input signal for generating a first signal including a low impedance portion corresponding to the duration of the second level of the input signal. A second circuit responsive to the input signal is further provided to supply a second signal including a low impedance portion which exists after the duration of the second voltage level of the input signal. The first and the second signals are combined to produce the output signal.

4 Claims, 3 Drawing Sheets

OUTPUT CIRCUIT FOR A SEMICONDUCTOR DEVICE FOR REDUCING RISE TIME OF AN OUTPUT SIGNAL

BACKGROUND OF THE INVENTION

1. Field of the Invention This invention concerns an output circuit for a semiconductor device. More particularly, this invention concerns an output circuit which can transmit a signal at high speed when a number of semiconductor devices are connected and used together.

2. Description of the Prior Art

Conventionally, to supply a synthesized signal of output signals from several semiconductor devices to a following semiconductor device, a wired OR circuit composed of several semiconductor devices, each having an open drain type output circuit as shown in FIG.1, is used. The open drain type output circuit of FIG i includes a MOS transistor 1 having a gate electrode being supplied with an input signal Si, and a drain electrode directly connected to an output terminal 2.

As shown in FIG.2, in order to connect several of these semiconductor devices 3 in parallel, the open drain type output terminals 2 of each semiconductor device 3 are connected together to construct a wired OR circuit. A resistor R is connected between a power source terminal 4 and an output terminal 20 in order to make an output signal So a high level when all the output signals from the semiconductor devices 3 are at a high level and the output impedance of the respective semiconductor device 3 is high. The output signal So is used as an input signal for a following semiconductor device 5.

As shown in FIG.2, a wired OR circuit can be made by interconnecting output terminals 2 to which the drains of the MOS transistors 1 of the individual semiconductor devices 3 are directly connected, and also connecting the resistor R between the output terminal 20 and the power source terminal 4. In this construction, when any one of MOS transistors 1 in the semiconductor devices 3 becomes conductive, the potential of the output signal So is reduced to a partial voltage of the power source voltage Vcc in accordance with the ratio of the resistance value of the resistor R and the ON resistance of MOS transistor 1 which is conductive.

FIG.3 shows the relationship between the input signal Si to the MOS transistor 1 of any of the semiconductor devices 3 and the change of the potential at the output terminal 20 in FIG.2. In the condition when all the input signals Si of semiconductor devices 3 are low level, all the MOS transistors 1 are non-conductive, and output signal So is pulled-up to the power source voltage Vcc due to the resistor R.

Here, when an input signal Si of any one of semiconductor devices 3 becomes high level, the output signal So reduces to the voltage described above. Also, when the input signals Si of all semiconductor devices 3 become low level, the potential of the output signal So increases to the power source voltage Vcc in accordance with a time constant RC determined by the resistance value of the resistor R and the capacitance C of the output terminal 20, so that all MOS transistors 1 become non-conductive. The capacitance C is a total of the capacitances due to the semiconductors 3, the following semiconductor device 5 and the wiring for the output terminal 20, etc.

In a system as shown in FIG.2, when any one of the output MOS transistors 1 of the semiconductor devices 3 becomes conductive, a current flows through the power source terminal 4, the resistor R, the MOS transistor I, which is in the conductive state, and the ground terminal 6. Generally, the value of the resistor R is set from several k$\Omega$ to several 10s of k$\Omega$ in order to reduce the consumption current. When the system becomes large-scale, the number of semiconductor devices 3 which make up the wired OR circuit is increased and the semiconductor devices which are supplied with the output signal So as their input is increased. Thus, the wiring for the output signal So also increases, and the capacitance C of the output terminal becomes larger.

Here, if the resistance value of the resistor R and the capacitance C are respectively assumed to be 10 k$\Omega$ and 50 PF, the time T taken for the output signal So to rise from a low level to the power source voltage Vcc becomes the large value of T=RC=10 k$\Omega \times$ 50 PF=500 nsec. In order to make this T a small value, since the capacitance 0 is determined when the system is determined, the resistance R must be reduced. However, in the case where the resistor R has small resistance value, the current flowing through the resistor R increases, and the power consumption is increased.

Furthermore, when the current flowing through the resistor R is large, the falling time of the output signal So from a high level to a low level becomes large, because the relatively large current flows as a charge current to the capacitance 0 when the discharge current flows through the MOS transistor 1, which is conductive. In addition, since the level of the output signal is determined by the ratio of the resistor R and the ON resistance of the MOS transistor 1, the low level of &he output signal So become relatively high.

In this way, when using the semiconductor devices with the conventional open drain type output terminal, if those output terminals were connected to construct a wired OR circuit and a resistor R is connected between those output terminals and the power source terminal, there is a problem in that, the higher the value of the resistor R, the slower the rising time of &he output signal, and the lower the resistance value of the resistor R, the greater the consumption current and the slower the falling time of the output signal.

SUMMARY OF THE INVENTION

Therefore, an object of this invention is to provide an output circuit in which high-speed operation is possible even though the resistance value of the resistor connected between the output terminal and the power source terminal is increased to reduce the power consumption.

To achieve the above object, this invention provides an output circuit for generating an output signal having at least two voltage levels in response to an input signal having corresponding voltage levels, comprising: first circuit means for generating a first signal, the first signal changing between high and low impedance levels in response to changes between the two voltage levels of the input signal; second circuit means responsive to the input signal for supplying a second signal, the second signal changing between high and low impedance levels, and including control circuit means for delaying the changing of the impedance level of the second signal until after the impedance level of the first signal has changed; and means for combining the first and the second signals to produce the output signal.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

An embodiment of this invention is described below with reference to the drawings.

Figure 4:
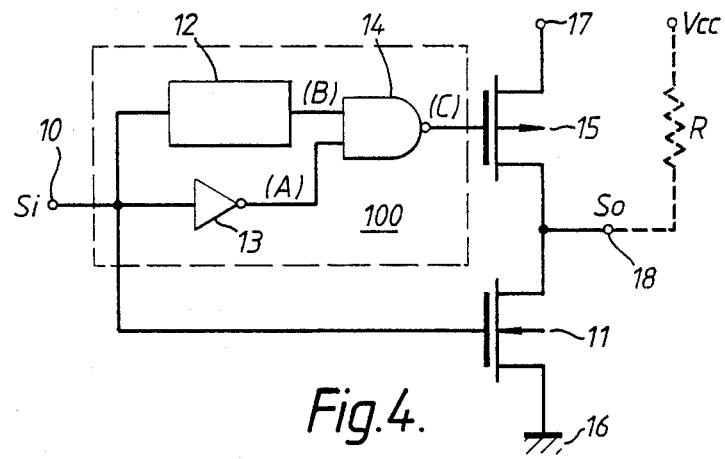
FIG.4 is an output circuit diagram of a preferred embodiment of this invention.

FIG.4 is a circuit diagram of a preferred embodiment of this invention. In the circuit, an input terminal 10 receives an input signal Si, and an output signal So is output from an output terminal 18.

In the present invention, there is provided first circuit means for generating a first signal which changes between high and low impedance levels in response to the input signal Si In the preferred embodiment of FIG.4, the first circuit means is an n-channel MOS transistor 11 which has a gate electrode connected to the input terminal 10, a source electrode connected to ground 16 and a drain electrode connected to the output terminal 18.

In the present invention, there is provided second circuit means responsive to the input signal Si for supplying a second signal which changes between high and low impedance levels. The second circuit means includes control circuit means for delaying the change of the impedance levels of the second signal until after the impedance level of the first signal has changed. In the preferred embodiment of FIG.4, the second circuit means includes a delay circuit 12, an inverter circuit 13, a NAND circuit 14 and a p-channel MOS transistor 15. The delay circuit 12 is connected between the input terminal 10 and a first input terminal of the NAND circuit 14 to delay the input signal to the NAND circuit 14.

The inverter circuit 13 is connected between the input terminal 10 and a second input terminal of the NAND circuit 14 to invert the input signal to the NAND circuit 14. The gate electrode of the p-channel MOS transiStOr 15 is connected to the output of the NAND circuit 14, and the source and the drain electrodes thereof are connected to the power source terminal 17 and the output terminal 18.

In the present& invention, there is provided combining means to combine the first and the second signals of the first and the second circuit means. In the preferred embodiment of FIG.4, the combining means is a connection of the drain electrodes of the MOs transistors 11 and 15 to the output terminal 18.

Figure 5:
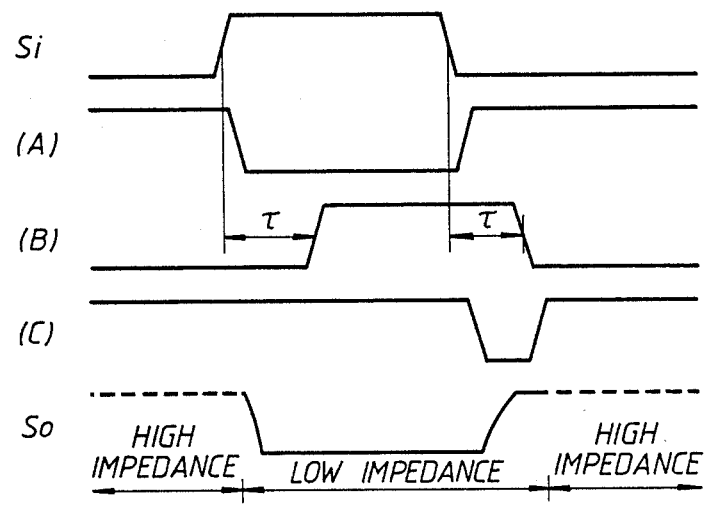
FIG.5 is a timing waveform diagram showing the operation of the circuit in FIG.4.

FIG.5 is a timing waveform diagram to illustrate the operation of the circuit of FIG. 4. In FIG.5, the symbols Si, (A), (B), (C) and So show the input signal Si, the signal (A) of the inverter 13, the output signal (B) of the delay circuit 12, the output signal (C) of the NAND circuit 14 and the output signal So, respectively.

The following is an explanation of the operation of the circuit of FIG.4 by reference to FIG.5. When the input signal Si is a level, the n-channel MOS transistor 11 is in a non-conductive state because its gate voltage is a level. In this case, the delayed signal (B) is a level, and the inverted signal (A) of the input signal Si is a high level. Thus, the output signal (0) of the NAND circuit 14 is a high level, and the p-channel MOS transistor 15 which is supplied with the signal (C) as the gate signal is in a nonconductive state. Namely, a control circuit means 100 composed of the delay circuit 12, the inverter circuit 13 and a NAND circuit 14, supplies a control signal to the p-channel MOS transistor 15 to change it to a conductive state during a predetermined time after the duration of the the high voltage level of the input signal Si. When both the MOS transistors 11 and 15 become non-conductive, the output impedance at the output terminal 18 is high.

Figure 1:
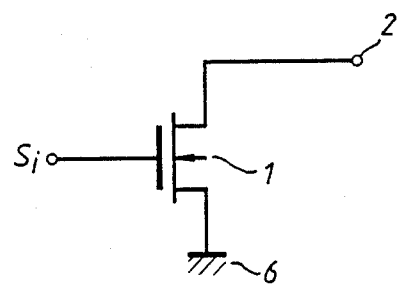
FIG.1 is a circuit diagram of a conventional output circuit using an open drain type MOS transistor.
Figure 2:
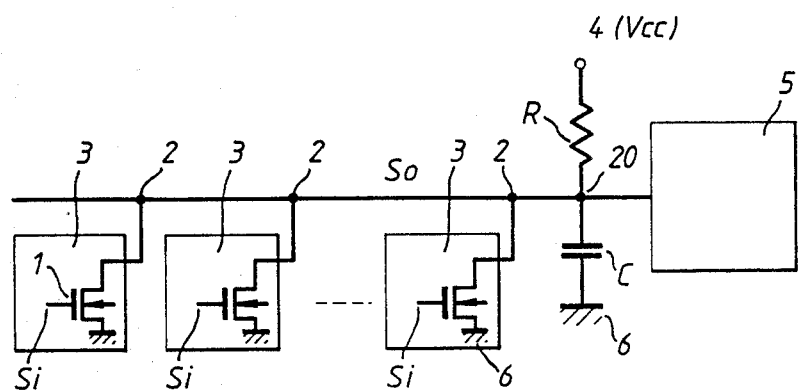
FIG.2 is a circuit diagram of a conventional wired OR circuit using the open drain type MOS transistors shown in FIG.1 by connecting them in parallel.
Figure 3:
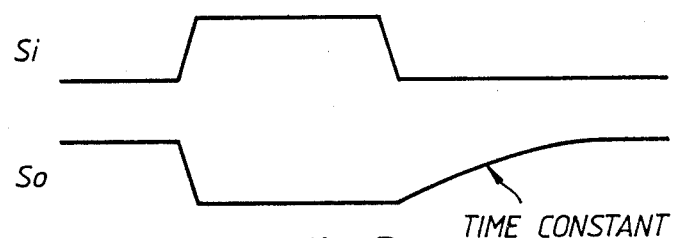
FIG.3 is a timing diagram showing the operation of the circuit in FIG.2.

In the case where a wired OR circuit using the several output circuits of FIG.4 is constructed (namely, devices 3 in FIG.2 are considered to be replaced by the output circuit of FIG.4), the voltage of the output terminal 18 becomes the power source voltage Vcc due to ±he resistor R which is connected between the power source terminal 4 and the output terminal 20 in FIG.2, when both the MOS transistors 11 and 15 in the respective output circuits are non-conductive.

Here, when the input signal Si becomes a high level, the n-channel MOS transistor 11 changes into a conductive state and the signal (B) becomes a high level after a certain time r, say 30 nsec, due to the delay circuit 12. However, since the signal (A) changes into a low level before the change of the signal (B) from the low level to a high level, the signal (C) maintains a high level and the p-channel MOS transistor 15 remains in the non-conductive state.

When the n-channel transistor 11 changes into a conductive state, the output signal So rapidly changes to a low level from the high level. Since a direct current flows from the power source terminal 4 to the ground 6 through the resistor R while the output signal So is a low level, it is necessary to use a resistor R of a high resistance value in order to reduce the consumption current.

When the input signal Si ceases and its level becomes low, the n-channel MOS transistor 11 changes into a non-conductive state. At the same time, the signal (A) becomes a high level, and the signal (B) keeps its high level until after the previously mentioned time r, say 30 nsec, and then changes into a low level. Therefore, after the signal (A) has changed into a high level, the logical NAND signal (C) of the signals (A) and (B) becomes a low level until the signal (B) changes into a low level, and the p-channel MOS transistor 15 becomes conductive during the time when the signal (C) is a low level. When the p-channel MOS transistor 15 becomes conductive, the output signal So rapidly changes into a high level from a low level.

The output terminal 18 has low output impedance after the n-channel MOS transistor 11 has become conductive until the p-channel MOS transistor 15 becomes non-conductive. When the p-channel MOS transistor 15 changes into a non-conductive state, the output terminal 2 once more has high output impedance and the output signal So is maintained or stabilized to the high level due to the resistor R connected to the power source terminal 4.

In this way, when a wired OR circuit is constructed using the output circuits according to this invention, the change of the output signal So is speeded-up, since the n-channel MOS transistor 11 changes into a conductive state when the input signal si becomes a high level to change the output signal So into low level, and the p-channel MOS transistor 15 changes into the conductive state when the input signal Si becomes a low level to change the output signal So a into high level, respectively. Namely, the current to raise the output signal So flows not only in the resistor R, but also in the p-channel transistor 15 of relatively small ON resistance to raise the output signal level rapidly.

Moreover, since the resistor R is required only to maintain the output signal So at a high level when the output terminal 20 is in a state of high impedance, its value can be made large. Thus, it is possible to reduce the current consumption. When the resistance value of the resistor R is large, the current which flows in the resistor R while the output signal So changes to low level can be reduced. Thus, the change of the output signal So from the high level to the low level can be accomplished, rapidly.

Since the output terminal 18 is in a high impedance state when the input signal Si is not being supplied, it is possible to connect several output terminals 18 in parallel to form a wired OR circuit.

Figure 6:
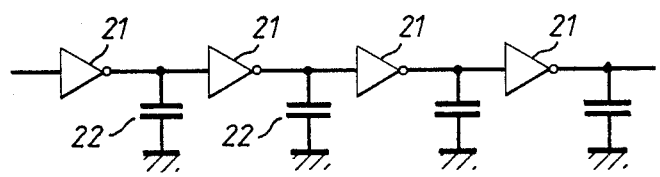
FIG.6 is a circuit diagram of a delay circuit used in the output circuit of FIG.4.

FIG. 6 is a circuit diagram of an example for the delay circuit 12 in FIG. 4. The delay circuit of FIG. 6 includes four stages of inverters 21 with timing adjustment capacitors 22 connected between their output terminals and ground. Here, the number of the stages may be increased or reduced according to the delay time to be required. Also, it is not necessary to insert a capacitor 22 at all inverter output stages, and they may be connected to arbitrary inverter outputs, according to the delay time to be required. Moreover, capacitors 22 may be inserted between the power source terminals and the inverter outputs, rather than the ground or they may be inserted between both.

Furthermore, the delay circuit 12 is not limited to that shown in FIG. 6. The important thing is that it can delay the transmission of the signal, and any circuit which can do this may be used.

Figure 7:
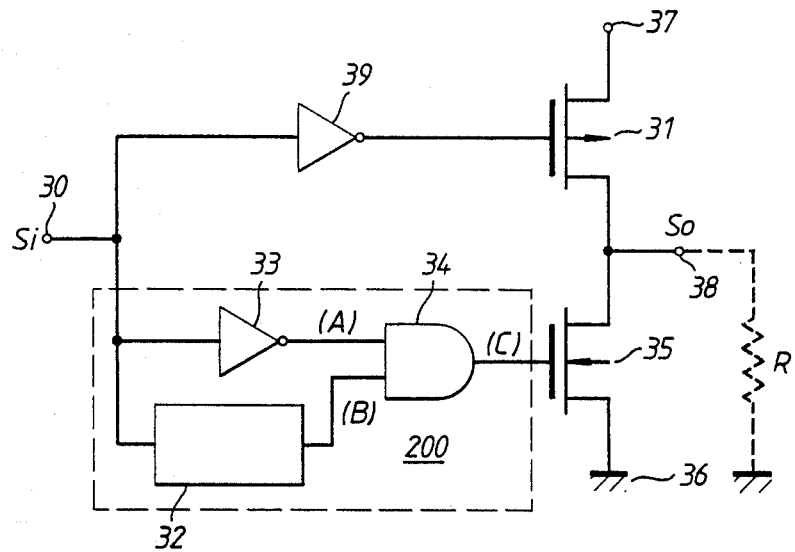
FIG. 7 is a circuit diagram of another embodiment of this invention.
Figure 8:
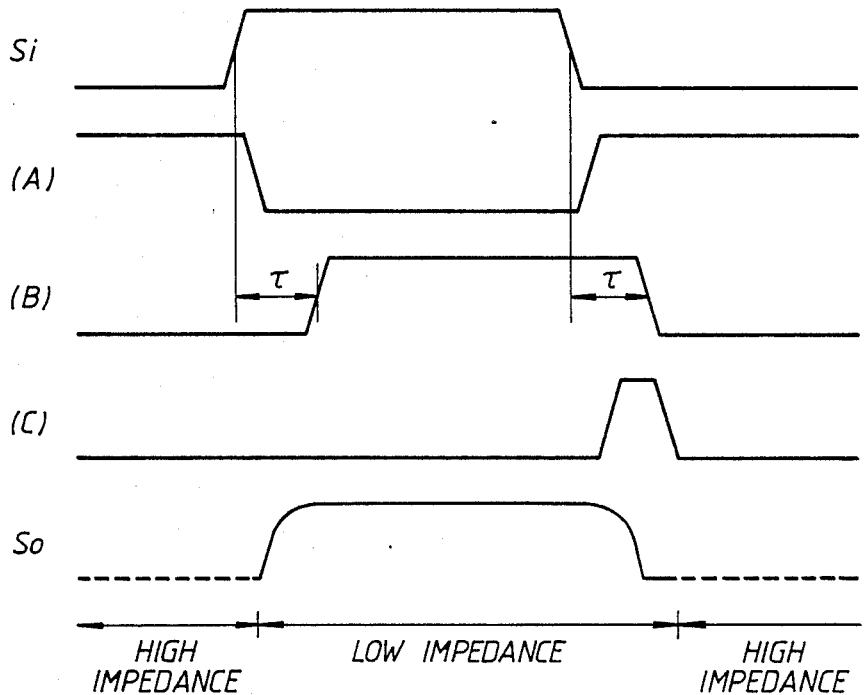
FIG.8 is a timing waveform diagram showing the operation of the circuit in FIG.7.

FIG. 7 is a circuit diagram of another embodiment of this invention, and FIG. 8 is a timing waveform diagram of the circuit.

In the preferred embodiment of FIG. 7, an input terminal 30 receives an input signal si, and the output signal So is output from an output terminal 38. In the embodiment of FIG. 7, the first circuit means includes an inverter 39 and a p-channel MOS transistor 31. The inverter circuit 39 is connected between the input terminal 30 and the p-channel MOS transistor 31. The gate electrode of the p-channel transistor 31 is connected to the inverter circuit 39, and the source and the drain electrodes thereof are connected to a power source terminal 37 and the output terminal 38, respectively.

In the embodiment of FIG. 7, the second circuit means includes a delay circuit 32, an inverter circuit 33, an AND circuit 34 and an n-channel MOS transistor 35. The delay circuit 32 is connected to the input terminal 30 to delay the input signal to the AND circuit 34, and the inverter circuit 33 is connected to the input terminal 30 to invert the input signal to the AND circuit 34. The gate electrode of the n-channel MOS transistor 35 is connected to the output of the AND circuit 34, and the source and the drain electrodes thereof are connected to the ground 36 and the output terminal 38, respectively. The connection of the drain electrodes of the MOS transistors 31 and 35 to the output terminal 38 combines the signals from the first and the second circuits.

In the case where the output terminal 38 is connected in a multiple parallel connection to form a wired OR circuit, a resistor R for maintaining the level of the output signal So low is connected between the output terminal 38 and the ground 36.

In this construction, since both p-channel and n-channel MOS transistors 31 and 35 become non-conductive when the input signal Si is not supplied and is at a low level, the level of the output signal So is kept constant at a low level due to the resistor R.

When the input signal Si of a high level is supplied, the n-channel MOS transistor 35 remains non-conductive, but the p-channel MOS transistor 31 changes to the conductive state. Thus the output impedance at the output terminal 38 becomes low and the output signal So changes to a high level rapidly When the input signal Si becomes a low level, the p-channel MOS transiStor 31 Changes into the non-conductive state, and the n-channel MOS transistor 35 becomes conductive for only the delay time of the delay circuit 32. This will rapidly make the output signal So a low level. In other words, a control circuit 200 composed of the delay circuit 32, the inverter circuit 33 and the AND circuit 34, supplies a control signal to the n-channel MOS transistor 35 to change it to be a conductive state during a predetermined time after the duration of the input signal Si. After the delay time of the delaY circuit 32, as the n-channel MOS transistor 35 changes to the non-conductive state, the output terminal 2 has high impedance and the output signal So is maintained or stabilized to the low level by the resistor R connected to ground.

In this way, in the case where a wired OR circuit is constructed using the second embodiment of FIG. 7, since one of the MOS transistors changes into the conductive state when the output signal So changes in response to a change of the input signal Si, the change of the output signal So can be made very rapid. Furthermore, since the resistor R connected between the output terminal 88 and the ground power source terminal is required only to maintain the output signal So at a low level when the output terminal 38 is in a state of high impedance, a resistor of high resistance value can be used. Thus, a reduction of the power consumption can be achieved. Moreover, since the output terminal 38 is in the high impedance state when no input signal Si is supplied, there is no problem to connect several output terminals 38 in parallel to construct a wired OR circuit.

The delay circuit in FIG. 6 can be used as the delay circuit 32 of FIG. 7 in the same way as in the first embodiment of FIG. 4.

As described above, when the output signal changes in response to the change of the input signal, either the p-channel MOS transistor which is connected between the positive power source terminal and the ground, or the n-channel MOS transistor which is connected between the ground and the output terminal, always changes to the conductive state. Thus, in the case where a wired OR circuit is constructed, even if the capacitance C of the output terminals is high, the change of the output signal is rapidly performed, and the problem of the slow change of the output signal being delayed by the time constant RC can be overcome.

Furthermore, when the output terminal is in the high impedance state, since there is no requirement for the resistor R, which maintains the level of the output signal constant to play any other role than just the level maintenance, it is possible to make its resistance value high. Consequently, the current flowing in the resistor R when an input signal is supplied can be made small. Thus, the conventional problem of reducing the resistance value and making the time constant RC smaller in order to speed up the change of the output signal and, as a result, increasing the current consumption, is overcome.

The present invention has been described with respect to a specific embodiment. However, other embodiments based on the principles of the present invention should be obvious to those of ordinary skill in the art. Such embodiments are intended to be covered by the claims.

What is claimed is:

1. An output circuit for generating an output signal having at least two voltage levels in response to an input signal having corresponding voltage levels, comprising:
    first circuit means for generating a first signal, the first signal changing between high and low impedance levels in response to changes between the two voltage levels of the input signal;
    second circuit means responsive to the input signal for supplying a second signal, the second signal changing between high and low impedance levels, and including control circuit means for delaying the changing of the impedance level of the second signal until after the impedance level of the first signal has changed; and
    means for combining the first and the second signals to produce the output signal; and wherein
    the control means delays the change of the second signal from the high impedance level to the low impedance level until after the change of the first signal from the low impedance level to the high impedance level;
    the first circuit means comprises a first MOS transistor of one conductivity type having a gate electrode for receiving the input signal;
    the second circuit means includes a second MOS transistor of a second conductivity type having a gate electrode;
    the control circuit means supplies a control signal to the gate electrode of the second MOS transistor for controlling the conductivity of the MOS transistor; and
    the control circuit means includes inverter circuit means for inverting the input signal, delay means for delaying the input signal and NAND circuit means for producing a logic signal in response to the delay means and the inverter circuit means.

2. An output circuit for generating an output signal having at least two voltage levels in response to an input signal having corresponding voltage levels, comprising:
    first circuit means for generating a first signal, the first signal changing between high and low impedance levels in response to changes between the two voltage levels of the input signal;
    second circuit means responsive to the input signal for supplying a second signal, the second signal changing between high and low impedance levels, and including control circuit means for delaying the changing of the impedance level of the second signal until after the impedance level of the first signal has changed; and
    means for combining the first and the second signals to produce the output signal; and wherein
    the control means delays the change of the second signal from the high impedance level to the low impedance level until after the change of the first signal from the low impedance level to the high impedance level;
    the first circuit means comprises a first MOS transistor of one conductivity type having a gate electrode for receiving the input signal;
    the second circuit means includes a second MOS transistor of a second conductivity type having a gate electrode;
    the control circuit means supplies a control signal to the gate electrode of the second MOS transistor for controlling the conductivity of the second MOS transistor; and
    the control circuit means includes delay means for delaying the input signal, inverter circuit means for inverting the input signal, and AND circuit means for producing a logic signal in response to the delay means and the inverter circuit means.

3. An output circuit for outputting an output signal in response to an input signal having first and second voltage levels, in which the second voltage level of the input signal continues for a prescribed duration of time, comprising:
    first circuit means responsive to the input signal for generating a first signal including a low impedance portion corresponding to the duration of the second level of the input signal;
    second circuit means responsive to the input signal for supplying a second signal including a low impedance portion after the duration of the second voltage level of the input signal; and
    means for combining the first and the second signals to produce the output signal; and wherein
    the first circuit means comprises a first MOS transistor of one conductivity type having a gate electrode for receiving the input signal;
    the second circuit means includes a second MOS transistor of a second conductivity type having a gate electrode;
    control signal output circuit means for supplying a control signal to the gate electrode of the second MOS transistor controls the conductivity of the second MOS transistor; and
    the control signal output circuit means comprises delay circuit means for delaying the input signal, inverter circuit means for inverting the input signal and NAND circuit means for producing a logic signal in response to the delay circuit means and the inverter circuit means.

4. An output circuit for outputting an output signal in response to an input signal having first and second voltage levels, in which the second voltage level of the input signal continues for a prescribed duration of time, comprising:

first circuit means responsive to the input signal for generating a first signal including a low impedance portion corresponding to the duration of the second level of the input signal;

second circuit means responsive to the input signal for supplying a second signal including a low impedance portion after the duration of the second voltage level of the input signal; and means for combining the first and the second signals to produce the output signal; and wherein the first circuit means comprises a first MOS transistor of one conductivity type having a gate electrode for receiving the input signal;

the second circuit means includes a second MOS transistor of a second conductivity type having a gate electrode;

control signal output circuit means for supplying a control signal to the gate electrode of the second MOS transistor controls the conductivity of the second MOS transistor; and the control signal output circuit means includes delay circuit means for delaying the input signal, inverter circuit means for inverting the input signal and AND circuit means for producing a logic signal in response to the delay circuit means and the inverter circuit means.

* * * * *